(12) United States Patent
Schee et al.

(10) Patent No.: US 10,620,270 B2
(45) Date of Patent: Apr. 14, 2020

(54) INTERACTIVE LOGO INDICATIVE OF REMAINING POWER FROM BATTERY

(71) Applicant: HEWLETT-PACKARD DEVELOPMENT COMPANY, L.P., Houston, TX (US)

(72) Inventors: Eric Schee, Shanghai (CN); Jun Long, Shanghai (CN); Zheng Liu, Shanghai (CN)

(73) Assignee: Hewlett-Packard Development Company, L.P., Spring, TX (US)

( * ) Notice: Subject to any disclaimer, the term of this patent is extended or adjusted under 35 U.S.C. 154(b) by 316 days.

(21) Appl. No.: 15/519,687

(22) PCT Filed: Dec. 16, 2014

(86) PCT No.: PCT/CN2014/093951
§ 371 (c)(1),
(2) Date: Apr. 17, 2017

(87) PCT Pub. No.: WO2016/095104
PCT Pub. Date: Jun. 23, 2016

(65) Prior Publication Data
US 2017/0276736 A1    Sep. 28, 2017

(51) Int. Cl.
*G01R 31/371*    (2019.01)
*G06F 3/0481*    (2013.01)
*G01R 31/36*    (2020.01)
*H01M 10/48*    (2006.01)
*G08B 5/36*    (2006.01)

(52) U.S. Cl.
CPC ....... *G01R 31/371* (2019.01); *G01R 31/3646* (2019.01); *G06F 3/0481* (2013.01); *G08B 5/36* (2013.01); *H01M 10/48* (2013.01)

(58) Field of Classification Search
None
See application file for complete search history.

(56) References Cited

U.S. PATENT DOCUMENTS 6,014,141 A  *  1/2000  Klein ................... G06F 1/1616
                                                     345/3.1
8,044,815 B2    10/2011  Du et al.
(Continued)

FOREIGN PATENT DOCUMENTS

CN    1838086        9/2006
CN    1838086  A     9/2006
(Continued)

OTHER PUBLICATIONS

Sigma Sports: "Rechargable Bicyle Light", Sep. 29, 2017, pp. 1-1, XP055461663, Youtube Retrieved from the Internet: URL:https://www.youtube.com/watch?v=idSuObZRDq4.
(Continued)

*Primary Examiner* — Mirza F Alam
(74) *Attorney, Agent, or Firm* — HPI Patent Department

(57) ABSTRACT

An interactive logo includes a graphical mark, at least one property of the graphical mark, and a logo surface. The graphical mark is disposed on an enclosure of the electronic device to identify a company, an organization, or a brand. At least one property of the graphical mark changes corresponding to an amount of power remaining from a battery to power the electronic device.

9 Claims, 5 Drawing Sheets

(56) References Cited

U.S. PATENT DOCUMENTS

| | | | |
|---|---|---|---|
| 8,351,868 B2 | 1/2013 | Garra et al. | |
| 2005/0110740 A1* | 5/2005 | Linzmeier | G09G 3/3406 345/102 |
| 2007/0139916 A1* | 6/2007 | Vermillion | F21L 4/005 362/208 |
| 2007/0205908 A1* | 9/2007 | Du | G08B 5/36 340/636.1 |
| 2014/0192481 A1 | 7/2014 | Wojcik et al. | |
| 2015/0346987 A1* | 12/2015 | Ren | G06F 1/32 345/589 |
| 2016/0048365 A1* | 2/2016 | Henderson | G06F 3/1423 345/473 |
| 2016/0138790 A1* | 5/2016 | Peterson | G02B 6/0073 362/23.12 |

FOREIGN PATENT DOCUMENTS

| | | |
|---|---|---|
| CN | 101666860 A | 3/2010 |
| CN | 102062839 A | 5/2011 |
| CN | 102497470 | 6/2012 |
| CN | 102497470 A | 6/2012 |
| CN | 202333077 U | 7/2012 |
| DE | 20218813 | 2/2003 |
| KR | 20050003848 | 1/2005 |
| WO | WO-2007001115 | 1/2007 |
| WO | WO-2008078851 | 7/2008 |

OTHER PUBLICATIONS

Doerffel, D. et al., "A Critical Review of Using the Peukert Equation for Determining the Remaining Capacity of Lead-acid and Lithium-ion Batteries"; Apr. 21, 2006; 2 pages.

Sigma sport;Sigma sport/stvzo-beleuchtung;To improve the functionality of our site we use coolies. By using the page you agree to the user of coolies<YOUTUBE>;Sep. 29, 2014.

* cited by examiner

INTERACTIVE LOGO INDICATIVE OF REMAINING POWER FROM BATTERY

BACKGROUND

Electronic devices include batteries. The batteries provide power to the electronic devices. During operation of the electronic devices, the power from the battery becomes depleted.

BRIEF DESCRIPTION OF THE DRAWINGS

Non-limiting examples are described in the following description, read with reference to the figures attached hereto and do not limit the scope of the claims. Dimensions of components and features illustrated in the figures are chosen primarily for convenience and clarity of presentation and are not necessarily to scale. Referring to the attached figures:

DETAILED DESCRIPTION

Electronic devices such as computing devices include batteries for operation thereof. The electronic device consumes power from the battery during operation thereof. The battery power status changes during operation of the electronic device. That is, an amount of remaining power from the battery decreases the longer the electronic device is in operation. Periodically, the battery may be out of power and in need of a recharge and/or replacement due to lack of power. At such time, the electronic device may be inoperable. Alternatively, a user may unnecessarily recharge the battery that may already have sufficient power remaining for uninterrupted use of the electronic device. Thus, inefficient usage of the electronic device and the battery may result.

In examples, an interactive logo usable on an electronic device includes a graphical mark, at least one property, and a logo surface. The graphical mark is disposed on an enclosure of the electronic device. The graphical mark identifies a company, an organization, or a brand. The at least one property of the graphical mark changes corresponding to an amount of power remaining from a battery to power the electronic device. For example, an appearance of the graphical mark continually changes in accordance with the battery power status. The logo surface activates and deactivates the at least one property of the graphical mark based on contact by a user there with. In response to activation (ON state) of the at least one property, the graphical mark indicates an amount of power remaining from the battery. Thus, the interactive logo may provide a plurality of functions including indicating the amount of power remaining from the battery to a user in a readily accessible manner. Thus, a user may not, unnecessarily, recharge and/or replace the battery. Accordingly, efficient usage of the electronic device and the battery may result.

Figure 1:
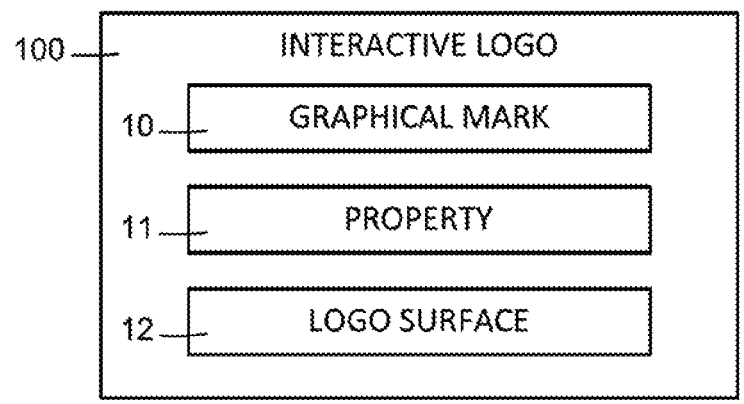
FIG. 1 is a block diagram illustrating an interactive logo according to an example.

FIG. 1 is a block diagram illustrating an interactive logo according to an example. The interactive logo 100 is useable with an electronic device. Referring to FIG. 1, interactive logo 100 includes a graphical mark 10, at least one property 11 of the graphical mark 10, and a logo surface 12. The graphical mark 10 is disposed on an enclosure of the electronic device. The graphical mark 10 identifies a company, an organization, or a brand. At least one property 11 of the graphical mark 10 changes corresponding to an amount of power remaining from a battery to power the electronic device. For example, an appearance of the graphical mark 10 may change along with a change of the battery power status. The logo surface 12 activates and deactivates the at least one property of the graphical mark 10 based on a contact by a user there with.

Figure 2:
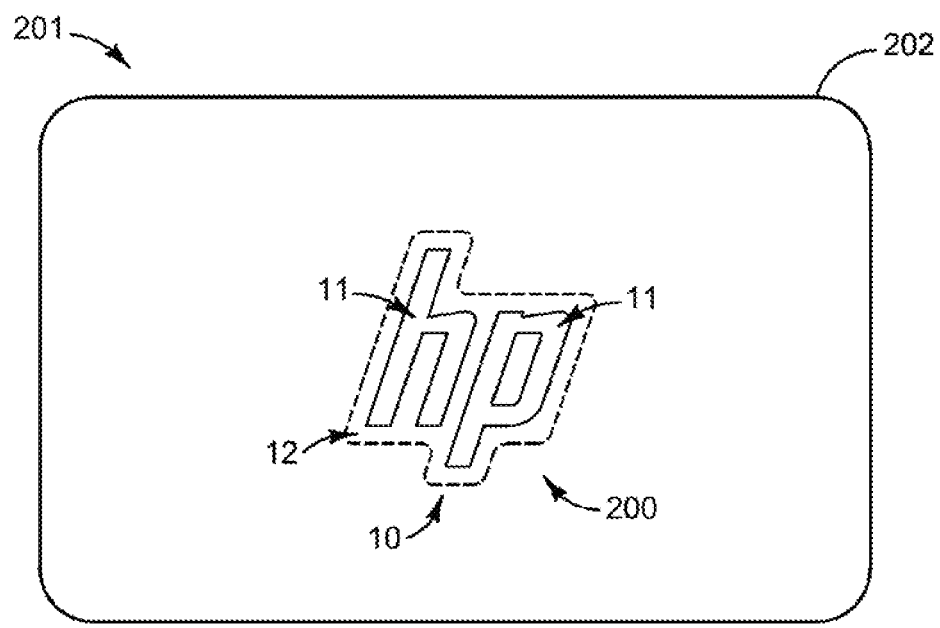
FIG. 2 is a schematic view of an interactive logo disposed on an electronic device according to an example.

FIG. 2 is a schematic view of an interactive logo disposed on an electronic device according to an example. The interactive logo 200 includes the graphical mark 10, the at least one property 11, and the logo surface 12 previously described with respect to the interactive logo 100 of FIG. 1. The graphical mark 10 is disposed on an enclosure 202 of the electronic device 201. The logo surface 12 activates and deactivates the at least one property 11 of the graphical mark 10 based on a contact by a user there with. In some examples, the logo surface 12 is one of a touch pad, a touch screen, and a mechanical switch. For example, the user may push the logo surface 12 to toggle the interactive logo 200 between an ON state and an OFF state. In the ON state, the interactive logo 200 indicates the battery power status and, in the OFF state, the interactive logo 200 does not indicate the battery power status.

Referring to FIG. 2, the graphical mark 10 identifies a company, an organization, or a brand. In some examples, the graphical mark 10 includes a plurality of alpha-numeric characters such as a letter, h, and a letter, p. Further, at least one property 11 of the graphical mark 10 changes corresponding to an amount of power remaining from a battery to power the electronic device 201. For example, an appearance of the graphical mark 10 may change along with a change of the battery power status. That is, an appearance of the graphical mark 10 may look different to indicate different amounts of power remaining from the battery to be available to operate the electronic device 201. In some examples, the at least one property 11 is one of a light intensity, a color, and an amount of fill within the graphical mark 10.

Figures 3A, 3B, 3C:
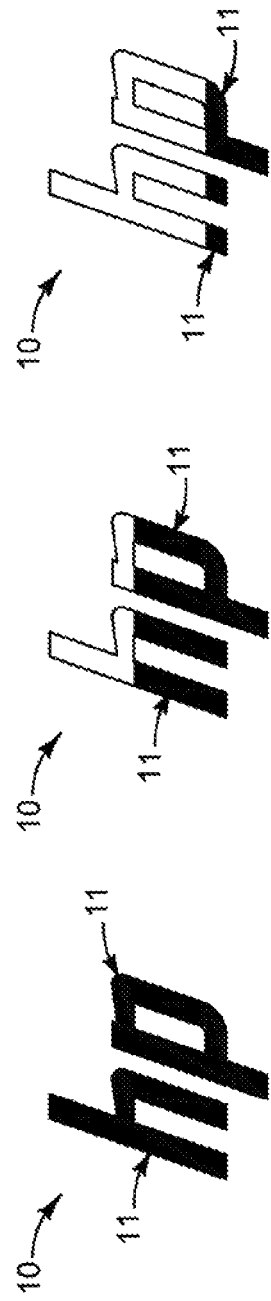
FIGS. 3A-3C are schematic views illustrating a property of a graphical mark of the interactive logo of FIG. 2 according to examples.
Figures 4A, 4B, 4C:
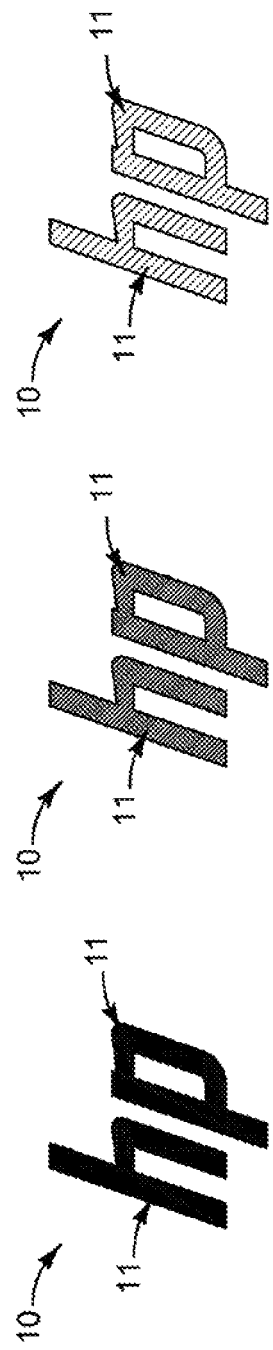
FIGS. 4A-4C are schematic views illustrating a property of a graphical mark of the interactive logo of FIG. 2 according to examples.

FIGS. 3A-3C are schematic views illustrating a property of a graphical mark of the interactive logo of FIG. 2 according to examples. FIGS. 4A-4C are schematic views illustrating a property of a graphical mark of the interactive logo of FIG. 2 according to examples. The graphical mark 10 includes the plurality of alpha-numeric characters such as a letter, h, and a letter, p, including a property 11 to correspond to an amount of power remaining from a battery to power the electronic device 201. The property 11 of the graphical mark 10, as illustrated in FIGS. 3A-3C, is an amount of fill of the graphical mark 10. In some examples, the at least one property 11 corresponds to at least three levels of power remaining from the battery. That is, the amount of power remaining from the battery may be indicated as discrete or continuous levels of power.

FIG. 3A illustrates 100% fill of the graphical mark 10 to correspond to 100% of remaining power from the battery. FIG. 3B illustrates 50% fill of the graphical mark 10 to correspond to 50% of remaining power from the battery. FIG. 3C illustrates 25% fill of the graphical mark 10 to correspond to 25% of remaining power from the battery. Thus, the greater the amount of fill of the graphical mark 10 corresponds to a greater amount of power remaining from the battery. Alternatively, the lesser amount of fill corresponds to a lesser amount of power remaining from the battery.

FIGS. 4A-4C are schematic views illustrating a property of a graphical mark of the interactive logo of FIG. 2 according to examples. The graphical mark 10 includes the plurality of alpha-numeric characters such as a letter, h, and a letter, p, including a property 11 to correspond to an amount of power remaining from a battery to power the electronic device 201. The property 11 of the graphical mark 10, as illustrated in FIGS. 4A-4C, is an amount of light intensity. In some examples, the at least one property 11 corresponds to at least three levels of power remaining from the battery. That is, the amount of power remaining from the battery may be indicated as discrete or levels of power.

FIG. 4A illustrates 100% light intensity of the graphical mark 10 (of an intensity scale of 100% to 0%) to correspond to 100% of remaining power from the battery. FIG. 4B illustrates 50% light intensity of the graphical mark 10 to correspond to 50% of remaining power from the battery. FIG. 4C illustrates 25% light intensity of the graphical mark 10 to correspond to 25% of remaining power from the battery. Thus, the greater the amount of light intensity of the graphical mark 10 corresponds to a greater amount of power remaining from the battery. Alternatively, the lesser amount of light intensity corresponds to a lesser amount of power remaining from the battery.

Figure 5:
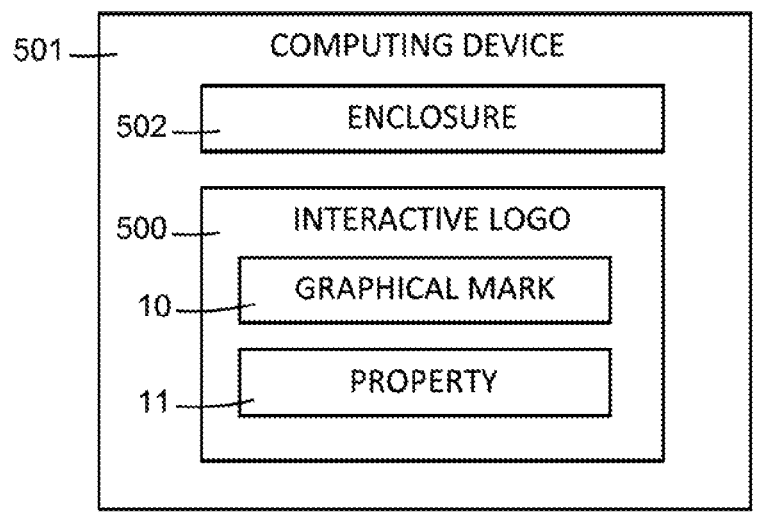
FIG. 5 is a block diagram illustrating a computing device according to an example.
Figure 6:
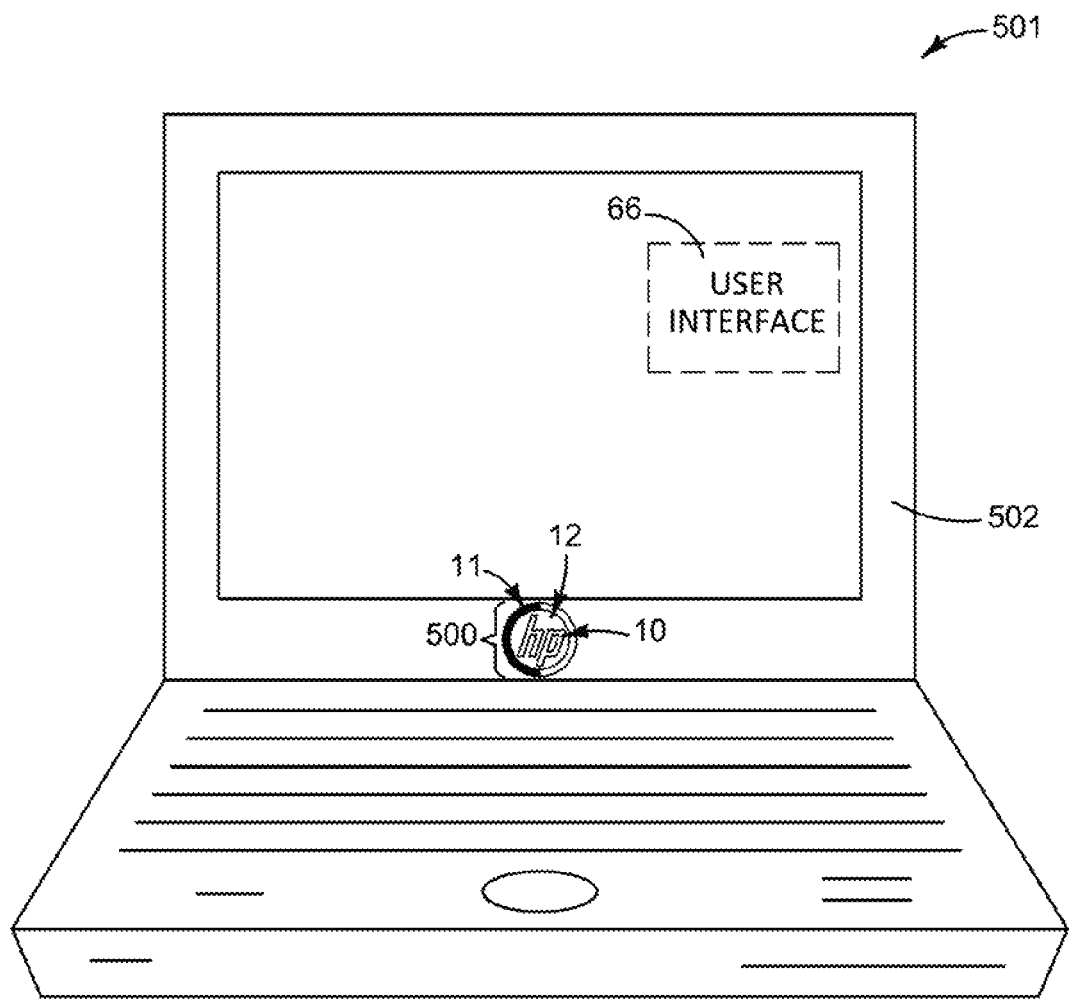
FIG. 6 is a schematic view of the computing device of FIG. 5 according to an example.

In some examples, color is the property 11 of the graphical mark 10 to correspond to an amount of power remaining from a battery to power the electronic device 201. For example, a darker shade of the color may correspond to a greater amount of power remaining from the battery. Whereas, a lighter shade of the color may correspond to a lesser amount of power remaining from the battery, FIG. 5 is a block diagram illustrating an interactive logo according to an example. FIG. 6 is a schematic view illustrating a computing device according to an example. Referring to FIGS. 5 and 6, in some examples, the computing device 501 includes an enclosure 502 and an interactive logo 500. The enclosure 502 may include a housing including an internal chamber to store electronic components to provide operability to the computing device 501. The interactive logo 500 is disposed on the enclosure 502 of the computing device 501. The computing device 501 may also include a logo surface 12 and a user interface 66.

Referring to FIGS. 5 and 6, the logo surface 12 activates and deactivates the at least one property 11 of the graphical mark 10 based on a contact by a user there with. In some examples, the logo surface 12 is one of a touch pad, a touch screen, and a mechanical switch. For example, the user may push the logo surface 12 to toggle the interactive logo 500 between an ON state and an OFF state. In the ON state, the interactive logo 500 indicates the battery power status and, in the OFF state, the interactive logo 500 does not indicate the battery power status. In same examples, the user interface 66 enables a user to select the at least one property such as a light intensity, a color, and an amount of fill of the graphical mark 10. The interactive logo 500 may be configurable, for example, through the user interface 66. For example, power option settings may be selected through a control panel, and the like. In some examples, a respective property 11 such as light intensity, color, and amount of fill of the graphical mark 10 may be chosen (selected) by a user.

Referring to FIGS. 5 and 6, the interactive logo 500 includes a graphical mark 10 and at least one property 11 of the graphical mark 10. The at least one property 11 of the graphical mark 10 changes corresponding to an amount of power remaining from a battery to power the computing device 501. The at least one property 11 may include a light intensity, a color, or an amount of fill within the graphical mark 10. For example, a greater amount of light intensity of the graphical mark 10 corresponds to a greater amount of power remaining from the battery. Alternatively, a lesser amount of light intensity corresponds to a lesser amount of power remaining from the battery. Also, in some examples, a darker shade of the color corresponds to a greater amount of power remaining from the battery. Alternatively, a lighter shade of the color corresponds to a lesser amount of power remaining from the battery. Further, in some examples, a greater amount of fill corresponds to a greater amount of power remaining from the battery. Alternatively, a lesser amount of fill corresponds to a lesser amount of power remaining from the battery.

Referring to FIG. 6, in some examples, the graphical mark 10 identifies a company, an organization, or a brand. In this example, as illustrated in FIG. 6, the graphical mark 10 includes a circle surrounding the alphanumeric letters, h, and p. The circle includes a property 11 of an amount of fill thereof. The amount of fill changes to correspond to a change of the amount of remaining power from the battery. That is, the amount of fill of the circle indicates the remaining amount of power from the battery such that the greater amount of fill within the circle indicates a greater amount of power remaining from the battery. Alternatively, the lesser amount of fill within the circle indicates a lesser amount of power remaining from the battery.

Figure 7:
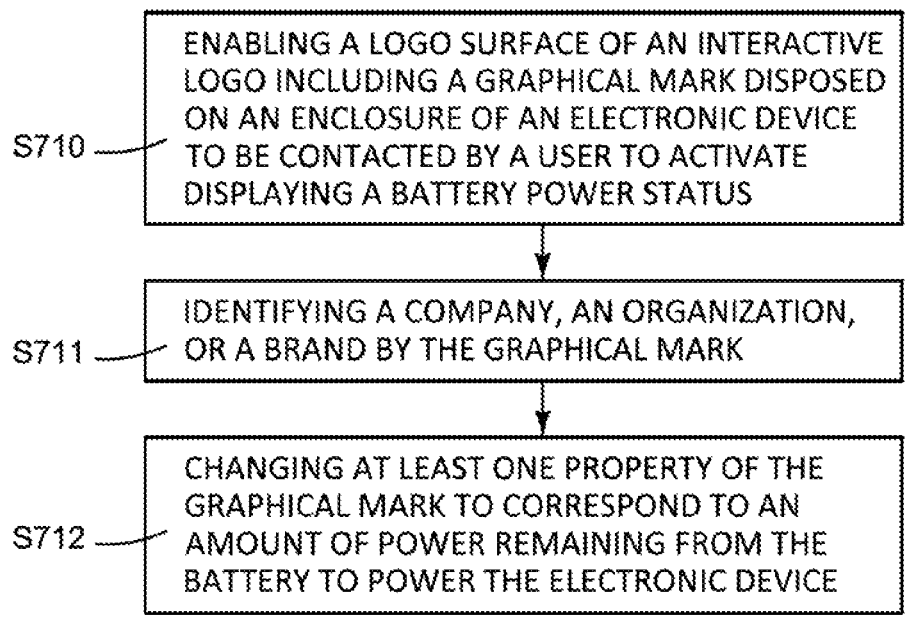
FIG. 7 is a flow chart illustrating a method of operating an electronic device according to an example.

FIG. 7 is a flow chart illustrating a method of operating electronic device according to an example. In some examples, the modules, assemblies, and the like, previously discussed with respect to FIGS. 1-4 may be used to implement the method of operating an electronic device 100 and 200 of FIGS. 1-4 In block S710, a logo surface of an interactive logo including a graphical mark disposed on an enclosure of the electronic device enables a contact by a user to activate displaying a battery power status. In block S711, a company, an organization, or a brand is identified by the graphical mark. In block S712, at least one property of the graphical mark changes to correspond to an amount of power remaining from the battery to power the electronic device. In some examples, at least one property is a light intensity, a color, or an amount of fill of the graphical mark 10, and the like.

It is to be understood that the flowchart of FIG. 7 illustrates architecture, functionality, and/or operation of examples of the present disclosure. If embodied in software, each block may represent a module, segment, or portion of code that includes one or more executable instructions to implement the specified logical function(s). If embodied in hardware, each block may represent a circuit or a number of interconnected circuits to implement the specified logical function(s). Although the flowchart of FIG. 7 illustrates a specific order of execution, the order of execution may differ from that which is depicted. For example, the order of execution of two or more blocks may be rearranged relative to the order illustrated. Also, two or more blocks illustrated in succession in FIG. 7 may be executed concurrently or with partial concurrence. All such variations are within the scope of the present disclosure.

The present disclosure has been described using non-limiting detailed descriptions of examples thereof that are not intended to limit the scope of the general inventive concept. It should be understood that features and/or operations described with respect to one example may be used with other examples and that not all examples have all of the features and/or operations illustrated in a particular figure or described with respect to one of the examples. Variations of examples described will occur to persons of the art. Furthermore, the terms "comprise," "include," "have" and their conjugates, shall mean, when used in the disclosure and/or claims, "including but not necessarily limited to."

It is noted that some of the above described examples may include structure, acts or details of structures and acts that may not be essential to the general inventive concept and which are described for illustrative purposes. Structure and acts described herein are replaceable by equivalents, which perform the same function, even if the structure or acts are different, as known in the art. Therefore, the scope of the general inventive concept is limited only by the elements and limitations as used in the claims.

What is claimed is:

1. An interactive logo usable on an electronic device, the interactive logo comprising:
   a graphical mark disposed on an enclosure of the electronic device to identify a company, an organization, or a brand;
   properties of the graphical mark, the properties including a light intensity of the graphical mark, a color, and an amount of fill within the graphical mark, wherein the properties are to change corresponding to an amount of power remaining from a battery to power the electronic device such that:
      a greater amount of light intensity corresponds to a greater amount of power remaining from the battery and a lesser amount of light intensity corresponds to a lesser amount of power remaining from the battery;
      a darker shade of the color corresponds to a greater amount of power remaining from the battery and a lighter shade of the color corresponds to a lesser amount of power remaining from the battery; and
      a greater amount of fill corresponds to a greater amount of power remaining from the battery and a lesser amount of fill corresponds to a lesser amount of power remaining from the battery; and
   a logo surface to cause the amount of power remaining from the battery to be displayed on the graphical mark via the property in response to contact by a user with the logo surface.

2. The interactive logo of claim 1, wherein the logo surface is one of a touch pad, a touch screen, and a mechanical switch.

3. The interactive logo of claim 1, wherein the properties correspond to at least three levels of power remaining from the battery.

4. The interactive logo of claim 1, wherein the graphical mark comprises a plurality of alpha-numeric characters.

5. The interactive logo of claim 4, wherein the alpha-numeric characters comprise a letter, h, and a letter, p.

6. A computing device, comprises:
   an enclosure; and
   an interactive logo disposed on the enclosure, the interactive logo including:
      a graphical mark to identify a company, an organization, or a brand; and
      properties of the graphical mark, the properties including a light intensity of the graphical mark, a color, and an amount of fill within the graphical mark, wherein the properties are to change corresponding to an amount of power remaining from a battery to power the computing device such that:
         a greater amount of light intensity corresponds to a greater amount of power remaining from the battery and a lesser amount of light intensity corresponds to a lesser amount of power remaining from the battery;
         a darker shade of the color corresponds to a greater amount of power remaining from the battery and a lighter shade of the color corresponds to a lesser amount of power remaining from the battery; and
         a greater amount of fill corresponds to a greater amount of power remaining from the battery and a lesser amount of fill corresponds to a lesser amount of power remaining from the battery; and
      a logo surface to cause the amount of power remaining from the battery to be displayed on the graphical mark via the property in response to contact by a user with the logo surface.

7. The computing device of claim 6, wherein the interactive logo further comprises:
   the logo surface to activate and deactivate the property of the graphical mark based on contact by a user therewith.

8. The computing device of claim 6, further comprising:
   a user interface to enable a selection of the properties of the graphical mark, wherein the property is selected from the color and the amount of fill of the graphical mark.

9. A method of operating an electronic device, the method comprising:
   enabling, in response to contact by a user, a logo surface of an interactive logo including a graphical mark disposed on an enclosure of the electronic device to cause an amount of power remaining in a battery of the electronic device to be displayed on the graphical mark via properties of the graphical mark, the properties of the graphical mark including a light intensity, a color, and an amount of fill within the graphical mark, wherein the properties are to change corresponding to an amount of power remaining from the battery of the electronic device such that:
      a greater amount of light intensity corresponds to a greater amount of power remaining from the battery and a lesser amount of light intensity corresponds to a lesser amount of power remaining from the battery;
      a darker shade of the color corresponds to a greater amount of power remaining from the battery and a lighter shade of the color corresponds to a lesser amount of power remaining from the battery; and
      a greater amount of fill corresponds to a greater amount of power remaining from the battery and a lesser amount of fill corresponds to a lesser amount of power remaining from the battery;
   identifying a company, an organization, or a brand by the graphical mark; and
   changing the property of the graphical mark to correspond to the amount of power remaining from the battery to power the electronic device.

* * * * *